US011545392B2

(12) United States Patent
Yu et al.

(10) Patent No.: US 11,545,392 B2
(45) **Date of Patent: *Jan. 3, 2023**

(54) SEMICONDUCTOR COMPONENT HAVING THROUGH-SILICON VIAS

(71) Applicant: TAIWAN SEMICONDUCTOR MANUFACTURING COMPANY, LTD., Hsinchu (TW)

(72) Inventors: Chen-Hua Yu, Hsinchu (TW); Cheng-Hung Chang, Hsinchu (TW); Ebin Liao, Xinzhu (TW); Chia-Lin Yu, Sigang Township (TW); Hsiang-Yi Wang, Hsinchu (TW); Chun Hua Chang, Zhubei (TW); Li-Hsien Huang, Puzi (TW); Darryl Kuo, Hsinchu (TW); Tsang-Jiuh Wu, Hsinchu (TW); Wen-Chih Chiou, Toufen (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 35 days.

This patent is subject to a terminal disclaimer.

(21) Appl. No.: 17/021,600

(22) Filed: Sep. 15, 2020

(65) Prior Publication Data

US 2021/0005515 A1 Jan. 7, 2021

Related U.S. Application Data

(60) Continuation of application No. 16/168,306, filed on Oct. 23, 2018, now Pat. No. 10,784,162, which is a (Continued)

(51) Int. Cl.
*H01L 21/768* (2006.01)
*H01L 23/48* (2006.01)
(Continued)

(52) U.S. Cl.
CPC .. *H01L 21/76898* (2013.01); *H01L 21/02271* (2013.01); *H01L 21/02274* (2013.01);
(Continued)

(58) Field of Classification Search
CPC ......... H01L 21/76898; H01L 21/02271; H01L 21/02274; H01L 21/30625;
(Continued)

(56) References Cited

U.S. PATENT DOCUMENTS 5,327,012 A 7/1994 Yano et al.
5,391,917 A 2/1995 Gilmour et al.
(Continued)

*Primary Examiner* — David A Zarneke
(74) *Attorney, Agent, or Firm* — Hauptman Ham, LLP

(57) ABSTRACT

A semiconductor component includes a substrate having an opening. The semiconductor component further includes a first dielectric liner in the opening, wherein the first dielectric liner having a thickness $T_1$ at a first end of the opening, and a thickness $T_2$ at a second end of the opening, and $R_1$ is a ratio of $T_1$ to $T_2$. The semiconductor component further includes a second dielectric liner over the first dielectric liner, wherein the second dielectric liner having a thickness $T_3$ at the first end of the opening, a thickness $T_4$ at the second end of the opening, $R_2$ is a ratio of $T_3$ to $T_4$, and $R_1$ is greater than $R_2$.

20 Claims, 9 Drawing Sheets

Related U.S. Application Data continuation of application No. 15/214,776, filed on Jul. 20, 2016, now Pat. No. 10,115,634, which is a division of application No. 14/033,862, filed on Sep. 23, 2013, now Pat. No. 9,418,923, which is a continuation of application No. 13/799,760, filed on Mar. 13, 2013, now Pat. No. 8,575,725, which is a division of application No. 13/085,668, filed on Apr. 13, 2011, now Pat. No. 8,487,410.

(51) Int. Cl.

| | |
|---|---|
| ***H01L 23/498*** | (2006.01) |
| ***H01L 21/02*** | (2006.01) |
| ***H01L 21/306*** | (2006.01) |
| ***H01L 21/3105*** | (2006.01) |
| ***H01L 21/321*** | (2006.01) |
| ***H01L 25/065*** | (2006.01) |
| ***H01L 25/11*** | (2006.01) |
| ***H01L 23/538*** | (2006.01) |
| ***H01L 25/04*** | (2014.01) |
| ***H01L 25/07*** | (2006.01) |
| ***H01L 25/075*** | (2006.01) |

(52) U.S. Cl.

CPC .. *H01L 21/30625* (2013.01); *H01L 21/31053* (2013.01); *H01L 21/3212* (2013.01); *H01L 21/76844* (2013.01); *H01L 21/76846* (2013.01); *H01L 23/481* (2013.01); *H01L 23/49827* (2013.01); *H01L 21/76831* (2013.01); *H01L 21/76832* (2013.01); *H01L 23/5383* (2013.01); *H01L 23/5384* (2013.01); *H01L 23/5385* (2013.01); *H01L 23/5386* (2013.01); *H01L 25/043* (2013.01); *H01L 25/0655* (2013.01); *H01L 25/072* (2013.01); *H01L 25/0753* (2013.01); *H01L 25/115* (2013.01); *H01L 2225/06541* (2013.01); *H01L 2225/06544* (2013.01); *H01L 2924/0002* (2013.01)

(58) Field of Classification Search

CPC ........... H01L 21/31053; H01L 21/3212; H01L 21/76844; H01L 21/76846; H01L 21/481; H01L 21/49827

See application file for complete search history.

(56) References Cited

U.S. PATENT DOCUMENTS

| | | | |
|---|---|---|---|
| 5,510,298 | A | 4/1996 | Redwine |
| 5,686,355 | A | 11/1997 | Sumi et al. |
| 5,767,001 | A | 6/1998 | Bertagnolli et al. |
| 5,998,292 | A | 12/1999 | Black et al. |
| 6,184,060 | B1 | 2/2001 | Siniaguine |
| 6,322,903 | B1 | 11/2001 | Siniaguine et al. |
| 6,350,685 | B1 | 2/2002 | Asahina et al. |
| 6,448,168 | B1 | 9/2002 | Rao et al. |
| 6,465,892 | B1 | 10/2002 | Suga |
| 6,472,293 | B2 | 10/2002 | Suga |
| 6,538,333 | B2 | 3/2003 | Kong |
| 6,599,778 | B2 | 7/2003 | Pogge et al. |
| 6,639,303 | B2 | 10/2003 | Siniaguine |
| 6,664,129 | B2 | 12/2003 | Siniaguine |
| 6,693,361 | B1 | 2/2004 | Siniaguine et al. |
| 6,740,582 | B2 | 5/2004 | Siniaguine |
| 6,756,672 | B1 | 6/2004 | You et al. |
| 6,800,930 | B2 | 10/2004 | Jackson et al. |
| 6,841,883 | B1 | 1/2005 | Farnworth et al. |
| 6,882,030 | B2 | 4/2005 | Siniaguine |
| 6,924,551 | B2 | 8/2005 | Rumer et al. |
| 6,962,867 | B2 | 11/2005 | Jackson et al. |
| 6,962,872 | B2 | 11/2005 | Chudzik et al. |
| 7,030,481 | B2 | 4/2006 | Chudzik et al. |
| 7,049,170 | B2 | 5/2006 | Savastiouk et al. |
| 7,060,601 | B2 | 6/2006 | Savastiouk et al. |
| 7,071,546 | B2 | 7/2006 | Fey et al. |
| 7,111,149 | B2 | 9/2006 | Eilert |
| 7,122,912 | B2 | 10/2006 | Matsui |
| 7,157,787 | B2 | 1/2007 | Kim et al. |
| 7,193,308 | B2 | 3/2007 | Matsui |
| 7,262,495 | B2 | 8/2007 | Chen et al. |
| 7,297,574 | B2 | 11/2007 | Thomas et al. |
| 7,335,972 | B2 * | 2/2008 | Chanchani .............. H01L 25/50 257/E21.705 |
| 7,355,273 | B2 | 4/2008 | Jackson et al. |
| 7,402,575 | B2 | 7/2008 | Mink et al. |
| 7,589,008 | B2 | 9/2009 | Kirby |
| 7,629,249 | B2 | 12/2009 | Borthakur |
| 7,755,194 | B1 | 7/2010 | Marathe et al. |
| 7,906,404 | B2 | 3/2011 | DeNatale et al. |
| 8,043,962 | B2 | 10/2011 | Jung et al. |
| 8,207,615 | B2 | 6/2012 | Lou et al. |
| 8,236,688 | B2 | 8/2012 | Yelehanka et al. |
| 8,283,237 | B2 | 10/2012 | Rajagopalan et al. |
| 8,287,647 | B2 | 10/2012 | Yoon et al. |
| 8,288,274 | B2 | 10/2012 | Kil et al. |
| 8,407,634 | B1 | 3/2013 | Moroz et al. |
| 8,426,977 | B2 | 4/2013 | Tanida et al. |
| 8,487,410 | B2 * | 7/2013 | Yu ....................... H01L 21/3212 257/621 |
| 8,530,349 | B2 | 9/2013 | Choi et al. |
| 8,575,725 | B2 * | 11/2013 | Yu ....................... H01L 21/3212 257/E21.597 |
| 9,177,857 | B2 | 11/2015 | Oshida et al. |
| 9,418,923 | B2 * | 8/2016 | Yu ..................... H01L 21/02274 |
| 9,704,798 | B2 | 7/2017 | Govindaraju et al. |
| 10,115,634 | B2 * | 10/2018 | Yu ..................... H01L 21/76898 |
| 10,121,875 | B1 | 11/2018 | Ho |
| 10,784,162 | B2 * | 9/2020 | Yu ..................... H01L 21/76898 |
| 2004/0029398 | A1 | 2/2004 | Lee |
| 2005/0136686 | A1 | 6/2005 | Kim |
| 2005/0242414 | A1 | 11/2005 | Angyal |
| 2007/0238279 | A1 | 10/2007 | Cerio, Jr. |
| 2008/0057736 | A1 | 3/2008 | Lee |
| 2009/0243046 | A1 | 10/2009 | Shi et al. |
| 2009/0321796 | A1 | 12/2009 | Inohara |
| 2010/0038800 | A1 | 2/2010 | Yoon et al. |
| 2010/0123256 | A1 | 5/2010 | Yoda et al. |
| 2010/0133696 | A1 | 6/2010 | Chen et al. |
| 2010/0133697 | A1 | 6/2010 | Nilsson |
| 2010/0237502 | A1 | 9/2010 | Yu et al. |
| 2011/0127158 | A1 | 6/2011 | Hamaya |
| 2011/0175236 | A1 * | 7/2011 | Lou .................. H01L 27/14618 257/774 |
| 2012/0056331 | A1 | 3/2012 | Park |
| 2012/0064713 | A1 | 3/2012 | Russell et al. |
| 2012/0070982 | A1 | 3/2012 | Yu et al. |
| 2012/0074520 | A1 | 3/2012 | Yang et al. |
| 2012/0074583 | A1 | 3/2012 | Dao |
| 2012/0091593 | A1 | 4/2012 | Cheng |
| 2012/0112324 | A1 | 5/2012 | Huang |
| 2012/0217611 | A1 | 8/2012 | Liu et al. |
| 2012/0264297 | A1 | 10/2012 | Chang et al. |
| 2013/0037953 | A1 | 2/2013 | Chen |
| 2013/0252416 | A1 | 9/2013 | Takeda |
| 2013/0320538 | A1 | 12/2013 | Jindal |
| 2013/0341799 | A1 | 12/2013 | Chen |
| 2014/0110374 | A1 | 4/2014 | Brencher |
| 2014/0159249 | A1 | 6/2014 | Uzoh |
| 2014/0231986 | A1 | 8/2014 | Dubin |
| 2015/0076666 | A1 | 3/2015 | Chiang |
| 2015/0228541 | A1 | 8/2015 | Liu |
| 2016/0351446 | A1 | 12/2016 | Yamaguchi |

* cited by examiner

SEMICONDUCTOR COMPONENT HAVING THROUGH-SILICON VIAS

PRIORITY CLAIM

This application is a continuation of U.S. application Ser. No. 16/168,306, filed Oct. 23, 2018, which is a continuation of U.S. application Ser. No. 15/214,776, filed Jul. 20, 2016, now U.S. Pat. No. 10,115,634, issued Oct. 30, 2018, which is a divisional of U.S. application Ser. No. 14/033,862, filed Sep. 23, 2013, now U.S. Pat. No. 9,418,923, issued Aug. 16, 2016, which is continuation of U.S. application Ser. No. 13/799,760, filed Mar. 13, 2013, now U.S. Pat. No. 8,575,725, issued Nov. 5, 2013, which is a divisional of U.S. application Ser. No. 13/085,668, filed Apr. 13, 2011, now U.S. Pat. No. 8,487,410, issued Jul. 16, 2013, which are incorporated herein by reference in their entireties.

TECHNICAL FILED

The disclosure relates generally to a semiconductor device, and more particularly to a structure and method for forming through-silicon vias.

BACKGROUND

Since the invention of integrated circuits, the semiconductor industry has experienced continuous rapid growth due to constant improvements in the integration density of various electronic components (i.e., transistors, diodes, resistors, capacitors, etc.). For the most part, this improvement in integration density has come from repeated reductions in minimum feature size, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required.

An additional limitation comes from the significant increase in the number and lengths of interconnections between devices as the number of devices increases. When the number and the lengths of interconnections increase, both circuit RC delay and power consumption increase.

Among the efforts for resolving the above-discussed limitations, three-dimensional integrated circuit (3D IC) and stacked dies are commonly used. Through-silicon vias (TSVs) are thus used in 3D IC and stacked dies for connecting dies. In this case, TSVs are often used to connect the integrated circuits on a die to the backside of the die. In addition, TSVs are also used to provide short grounding paths for grounding the integrated circuits through the backside of the die, which may be covered by a grounded metallic film.

The formation of the TSVs requires more process steps. The integrated circuit formation thus becomes more complicated, and hence problems may occur. New methods for forming TSVs are thus needed to continuously improve the TSV formation process.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over, above, or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
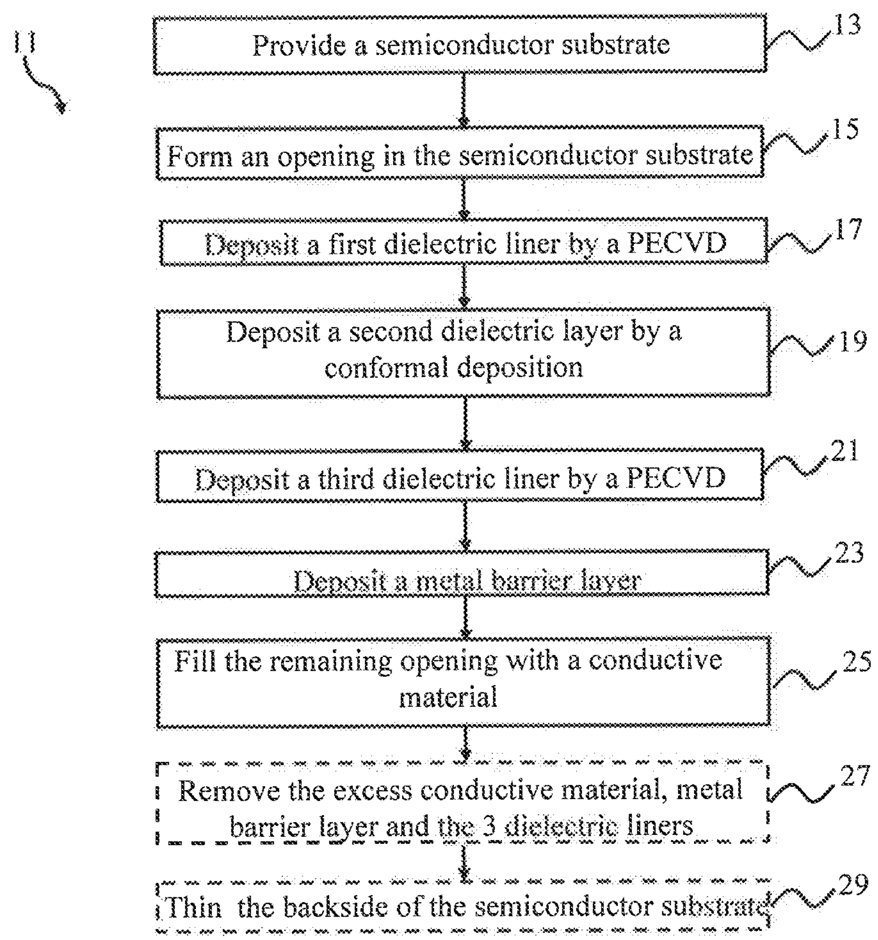
FIG. 1 is a flowchart of a method for fabricating through-silicon vias according to embodiments of the disclosure.

Illustrated in FIG. 1 is a flowchart of a method 11 for fabricating a semiconductor component with through-silicon vias according to embodiments of the disclosure. FIG. 2 to FIG. 9 are cross-sectional views showing various stages during fabrication of a semiconductor component 100 with through-silicon vias according to one or more embodiments according to FIG. 1. It is noted that some processes may only be briefly described herein for the sake of simplicity and clarity. Accordingly, it is understood that additional processes may be provided before, during, and after the method 11 of FIG. 1.

Referring now to FIG. 1, method 11 for fabricating a semiconductor component with through-silicon vias begins with operation 13. At operation 13, a semiconductor substrate is provided. A plurality of dies is fabricated on a semiconductor substrate. The dies on the semiconductor substrate are divided by scribe lines between the dies. The term "semiconductor substrate" herein generally refers to the semiconductor bulk substrate on which various layers and device structures may or may not be formed. In some embodiments, the semiconductor bulk substrate includes silicon or a compound semiconductor, such as GaAs, InP, Si/Ge, or SiC. Examples of such layers include dielectric layers, doped layers, polysilicon layers or conductive layers. Examples of device structures include transistors, resistors, and/or capacitors, which may or may not be interconnected through an interconnect layer to additional active circuits.

Next, method 11 continues with operation 15 in which the semiconductor substrate is patterned to form an opening in the semiconductor substrate.

Figure 2:
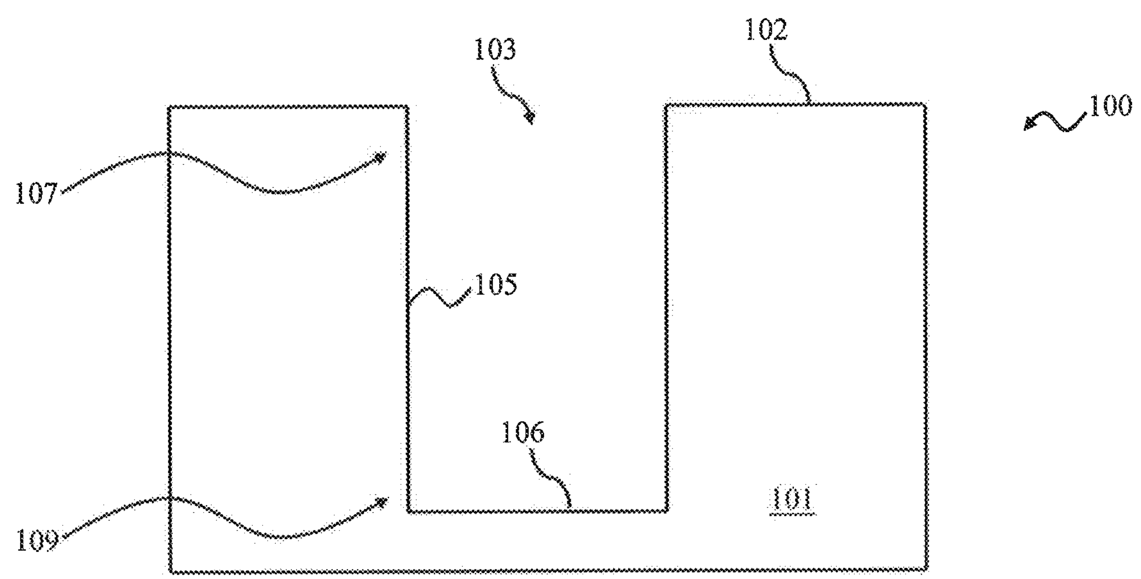
FIGS. 2 to 9 are cross-sectional views for forming through-silicon vias at various stages of manufacture according to FIG. 1.

Referring to FIG. 2, a magnified view of a portion of the semiconductor component 100 with a semiconductor substrate 101 is provided. The semiconductor substrate 101 having a top surface 102. A plurality of openings 103 are formed, extending through the top surface 102 into a predetermined depth of semiconductor substrate 101. In this example, only one opening 103 is shown for illustration purposes. In at least one embodiment, the opening 103 comprises a depth in a range of about 5 μm to about 150 μm, and a width in a range of about 1 μm to about 20 μm. The opening 103 comprises an interior surface 105, which is consisted of sidewalls, and a bottom surface 106 of the opening 103. The opening 103 further comprises a top portion 107 and a bottom portion 109. The top portion 107 is adjacent to the topmost of the opening 103 and also close to the top surface 102 of the semiconductor substrate 101. The bottom portion 109 is adjacent to the bottommost of the opening 103 and also close to the bottom surface 106 of the opening 103.

In one embodiment, the opening 103 may be formed by a dry etching process. Alternatively, the opening 103 may be formed by laser drilling. In one embodiment, a patterned masking layer (not shown) is formed over the semiconductor substrate 101 to cover the un-removed areas and expose portions of the semiconductor substrate 101 to enable the formation of the opening 103. The masking layer may be a hardmask comprising silicon nitride, oxide, or oxynitride formed through a process such as chemical vapor deposition (CVD). Once formed, the masking layer is patterned through suitable photolithographic and etching processes to expose those portions of the semiconductor substrate 101 that will form the opening 103. Then, the exposed semiconductor substrate 101 is removed by etching or laser drilling to form the opening 103. In another embodiment, a patterned and developed photoresist, may alternatively be utilized to protect the un-removed areas of the semiconductor substrate 101 while exposing portions of the substrate 101 to be removed to form the opening 103.

Referring back to FIG. 1, method 11 continues with operation 17 in which a first dielectric liner is deposited by a plasma enhanced chemical vapor deposition (PECVD) on the interior surface of the opening.

Figure 3:
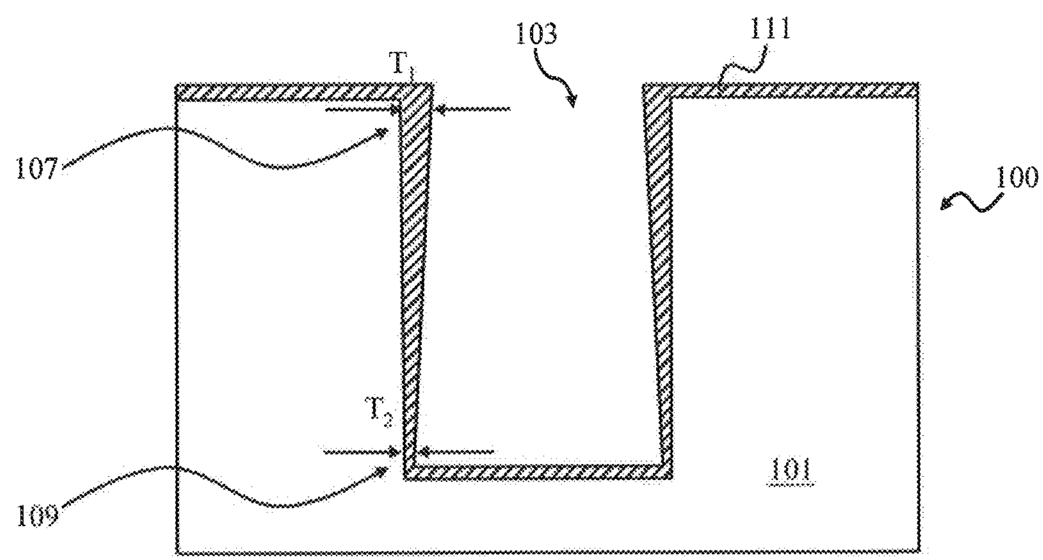

FIG. 3 illustrates the stage of operation 17 in which a cross-sectional view of the semiconductor component 100 is provided. A first dielectric liner 111 is formed on the interior surface 105 of the opening 103. The first dielectric liner 111 has a thickness $T_1$ on the top portion 107 of the opening 103 and a thickness $T_2$ on the bottom portion 109 of the opening 103. The thickness $T_1$ is in a range of about 200 Å to about 2000 Å, and the thickness $T_2$ is in a range of about 20 Å to about 200 Å. The first dielectric liner 111 becomes thinner gradually from the top portion 107 to the bottom portion 109. A ratio $R_1$ of the thickness $T_1$ to the thickness $T_2$ is about 5 to about 20. The first dielectric liner 111 may include silicon oxide, silicon nitride, silicon oxynitride, or PSG.

In one embodiment, the first dielectric liner 111 is formed by PECVD. In this example, a silicon oxide layer is formed as the first dielectric liner in a plasma environment comprising $O_3$ and TEOS. The flow rates of $O_3$ and TEOS are in a range of about 5000 standard cubic centimeters per minute (sccm) to about 10000 sccm, and of about 500 milligram per minute (mgm) to about 3000 mgm, respectively. An operation power of the plasma environment uses high frequency RF power set at about 300 W to about 500 W at 13.56 MHz, and low frequency RF power set at about 50 W to about 150 W at 350 kHz. An operation pressure of the plasma environment is about 2 Torr to about 8 Torr. An operation temperature on the substrate 101 of the semiconductor component 100 is about 150° C. to about 450° C. Under the above described conditions, the first dielectric liner 111 is formed with a first compressive stress within a range of about 100 MPa to about 400 MPa. The first dielectric liner 111 has a first etching rate of about 1 Å/min to about 10 Å/min in a HF solution, which is diluted at a rate of 1000:1. This disclosure is not limited to the above conditions for forming first dielectric liner 111, and differing conditions that produce either the above compressive stress or the above etch rate are within the scope of this disclosure.

PECVD uses a radio frequency (RF) power to generate a glow discharge to transfer the energy into the reactant gases, allowing the deposition on the interior surface 105 of the opening 103 and the top surface 102 of the semiconductor substrate 101 at a lower temperature. It is believed that the radicals with high energy in the plasma of PECVD repair the damaged interior surface 105 during operation 15 for the opening 103 formation. The dangling bonds and the defects on the interior surface 105 are removed. The interface between the first dielectric liner 111 and the interior surface 105 has fewer defects than conventional methods. Thus, desirable properties such as good adhesion, low pinhole density and adequate electrical properties of the deposited first dielectric liner 111 are produced.

Referring back to FIG. 1, method 11 continues with operation 19 in which a second dielectric liner is deposited by a conformal deposition on the first dielectric liner.

Figure 4:
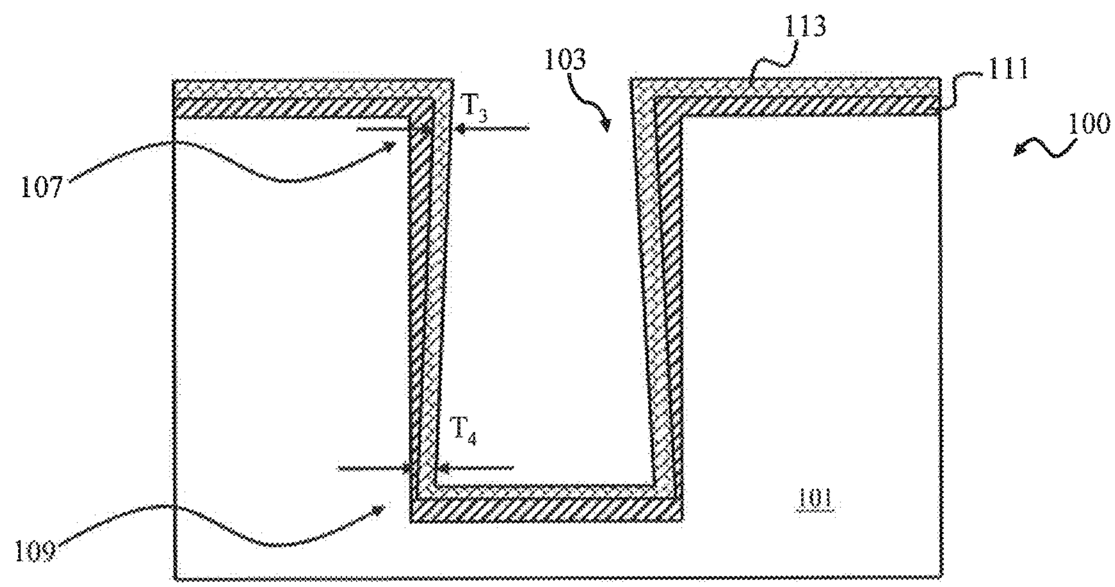

FIG. 4 illustrates the stage of operation 19 in which a second dielectric liner 113 is formed on the first dielectric liner 111. The second dielectric liner 113 has a thickness $T_3$ on the top portion 107 of the opening 103 and a thickness $T_4$ on the bottom portion 109 of the opening 103. The thickness $T_3$ is in a range of about 500 Å to about 2500 Å, and the thickness $T_4$ is in a range of about 500 Å to about 2500 Å. In one embodiment, the second dielectric liner 113 may be a completely conformal liner, some variation in the conformality of the second liner thickness has been found to have beneficial effects. A ratio $R_2$ of the thickness $T_3$ to the thickness $T_4$ is about 1 to about 5. Within the range of the ratio $R_2$, the second dielectric liner 113 still maintains beneficial effects of conformality.

In one embodiment, the second dielectric liner 113 is formed by high aspect ratio process (HARP) using an $O_3$/TEOS based sub atmospheric chemical vapor deposition process. In this example, an oxide layer is formed as the second dielectric liner. The flow rates of $O_3$ and TEOS are be in a range of about 10000 standard cubic centimeters per minute (sccm) to about 20000 sccm, and of about 500 mgm to about 3500 mgm, respectively. An operation pressure is about 400 Torr to about 650 Torr. An operation temperature on the semiconductor component 100 is about 200° C. to about 450° C. The reactants are heated under the operation temperature without plasma and deposit on the first dielectric liner 111. Under the above described condition, the second dielectric liner 113 is formed with a tensile stress within a range of about 50 MPa to about 300 MPa. The second dielectric liner 113 has a second etching rate of about 10 Å/min to about 50 Å/min in a HF solution, which is diluted at a rate of 1000:1. Alternatively, the second dielectric liner 113 may be formed by using a conformal deposition technique, such as atomic layer deposition (ALD) or a spin on dielectric (SOD) such as a silicate, a siloxane, a methyl SilsesQuioxane (MSQ), a hydrogen SisesQuioxane (HSQ), an MSQ/HSQ, a perhydrosilazane (TCPS) or a perhydro-polysilazane (PSZ).

This disclosure is not limited to the above conditions for forming the second dielectric liner 113, and different conditions that produce either the above compressive stress or the above etch rate are within the scope of this disclosure.

According to the above description, the ratio $R_1$ is greater than the ratio $R_2$. The second dielectric liner 113 has better conformality than the first dielectric liner 111. The second dielectric liner 113 smooths over the variation of the thickness of the combined layer of liner 111 and liner 113. The first etching rate is less than the second etching rate. Hence, the first dielectric liner 111 has a lower pinhole density than the second dielectric liner 113. The first dielectric liner 111 provides protection from moisture or contaminations diffuse from the semiconductor substrate 101 into the second dielectric liner 113.

Referring back to FIG. 1, method 11 continues with operation 21 in which a third dielectric liner is deposited by a plasma enhanced chemical vapor deposition (PECVD) on the second dielectric liner.

Figure 5:
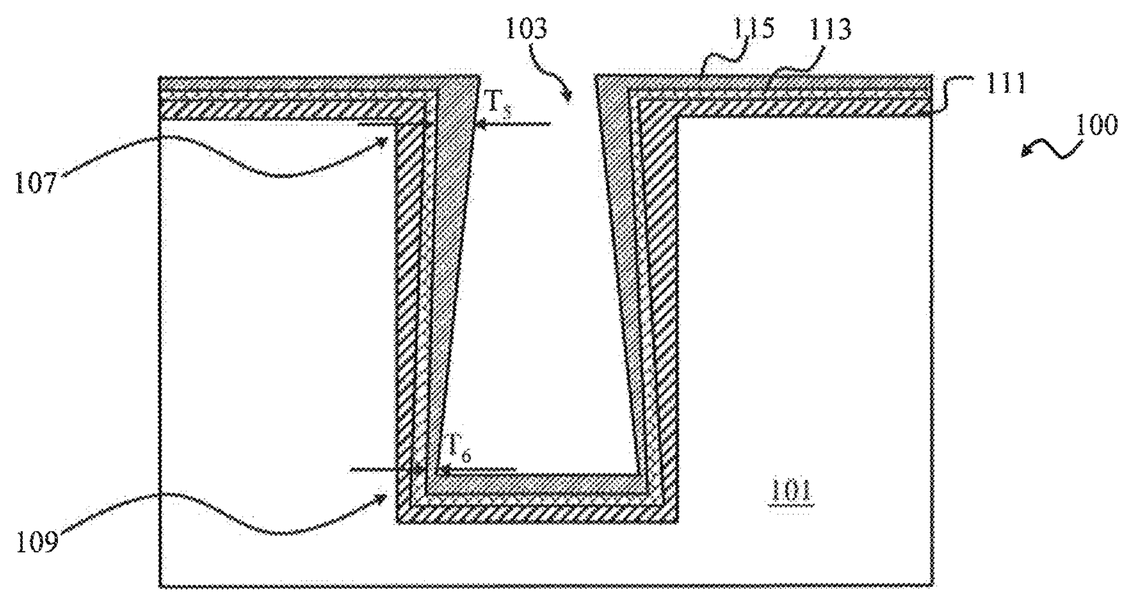

FIG. 5 illustrates the stage of operation 21 in which a cross-sectional view of the semiconductor component 100 is provided. A third dielectric liner 115 is formed on the second dielectric liner 113. The third dielectric liner 115 has a thickness $T_5$ on the top portion 107 of the opening 103 and a thickness $T_6$ on the bottom portion 109 of the opening 103. The thickness $T_5$ is in a range of about 200 Å to about 2000 Å, and the thickness $T_6$ is in a range of about 20 Å to about 200 Å. The third dielectric liner 115 becomes thinner gradually from the top portion 107 to the bottom portion 109. A ratio $R_3$ of the thickness $T_5$ to the thickness $T_6$ is about 5 to about 20. The third dielectric liner 115 may include silicon oxide, silicon nitride, silicon oxynitride, or PSG.

In one embodiment, the third dielectric liner 115 is formed by PECVD. In this example, a silicon oxide layer is formed as the third dielectric liner in a plasma environment comprising $O_3$ and TEOS. The flow rates of $O_3$ and TEOS are in a range of about 5000 standard cubic centimeters per minute (sccm) to about 10000 sccm, and of about 500 mgm to about 3000 mgm, respectively. An operation power of the plasma environment uses high frequency RF power set at about 300 W to about 500 W at 13.56 MHz, and low frequency RF power set at about 50 W to about 150 W at 350 kHz. An operation pressure of the plasma environment is about 2 Torr to about 8 Torr. An operation temperature on the semiconductor component 100 is about 150° C. to about 450° C. Under the above described condition, the third dielectric liner 115 is formed with a second compressive stress within a range of about 100 MPa to about 400 MPa. The third dielectric liner 115 has a third etching rate of about 1 Å/min to about 10 Å/min in a HF solution, which is diluted at a rate of 1000:1.

This disclosure is not limited to the above conditions for the formation of third dielectric liner 115, and other conditions that produce either the above compressive stress or the above etch rate are within the scope of this disclosure.

In one embodiment, the first dielectric liner 111 and the third dielectric liner 115 comprise the same dielectric material. The first compressive stress of the first dielectric liner 111 and the second compressive stress of the third dielectric liner 115 are equal. In another embodiment, the first dielectric liner 111 and the third dielectric liner 115 comprise different dielectric materials. The first compressive stress of the first dielectric liner 111 and the second compressive stress of the third dielectric liner 115 are different. At least one of the first compressive stress and the second compressive stress is within a range of about 100 MPa to about 400 MPa.

According to the above description, the third etching rate is less than the second etching rate. The third dielectric liner 115 may have a lower pinhole density than the second dielectric liner 113. The third dielectric liner 115 is formed between the second dielectric liner 113 and the later formed metal barrier layer 117 (shown in FIG. 6). The third dielectric liner 115 provides protection from contaminations diffuse from the later formed metal barrier layer 117 and the conductive material 119 into the semiconductor substrate 101. A robust electrical performance of the semiconductor component 100 is provided.

Referring back to FIG. 1, method 11 continues with operation 23 in which a metal barrier layer is deposited on the third dielectric liner.

Figure 6:
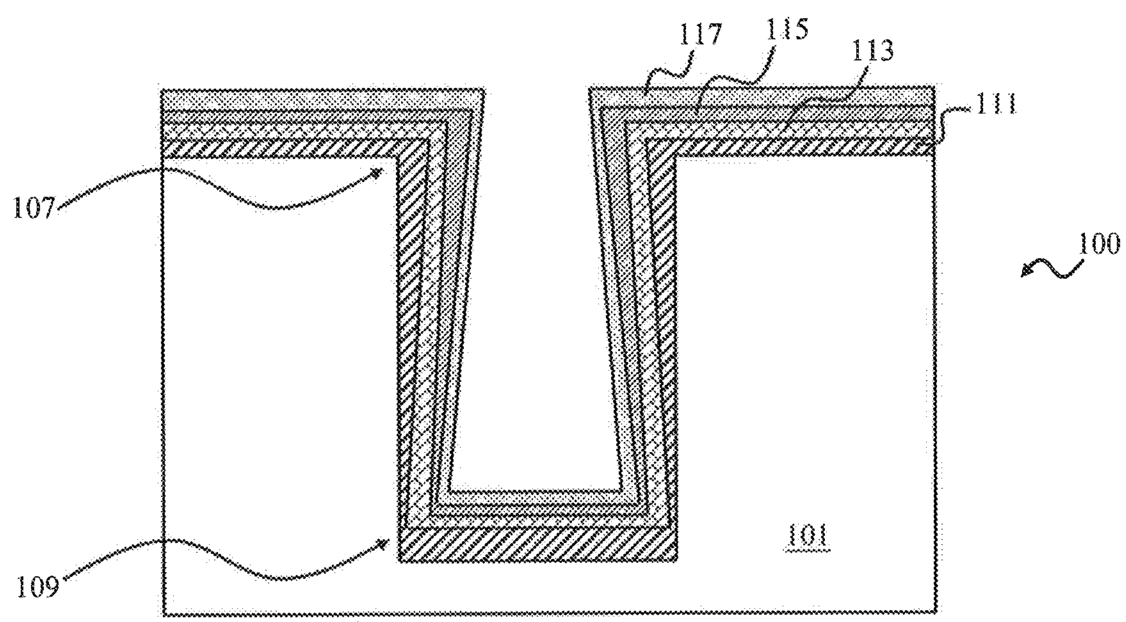

FIG. 6 illustrates the stage of operation 23 in which a cross-sectional view of the semiconductor component 100 is provided. A metal bather layer 117 is formed on the third dielectric liner 115. The metal barrier layer 117 may provide protection from metal ions, contaminations diffuse from the later formed conductive material 119 into the semiconductor substrate 101. The metal barrier layer 117 comprises tantalum nitride, although other materials, such as tantalum, titanium, titanium nitride, combinations of these, may alternatively be used. The formation methods of the metal barrier layer 117 include ALD, PECVD, or physical vapor deposition (PVD) processes.

Referring back to FIG. 1, method 11 continues with operation 25 in which the remaining opening after the deposition of the three dielectric liners and the metal barrier layer is filled with a conductive material.

Figure 7:
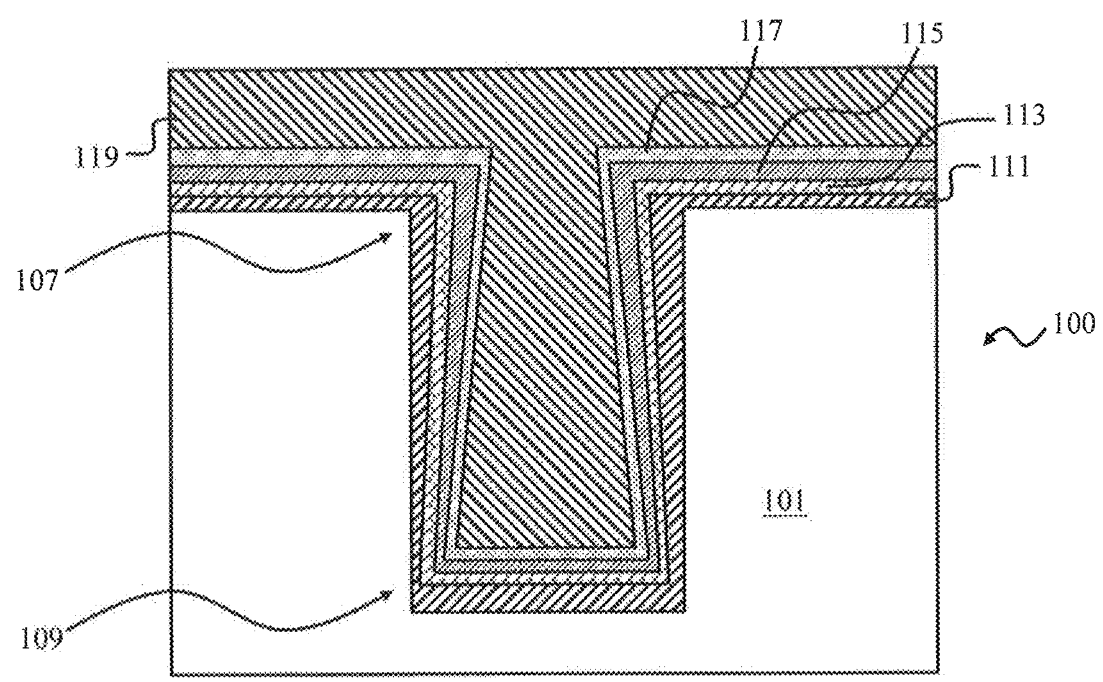

Referring to FIG. 7, the remaining opening 103 after the deposition of the three dielectric liners and the metal barrier layer 117 is filled with a conductive material 119. The conductive material 119 may overfill the remaining opening 103 and the metal barrier layer 117. The conductive material 119 may include copper or copper alloys. However, other metals, such as aluminum, silver, gold, and combinations thereof, may also be used. The possible formation methods include electroless plating, or other commonly used deposition methods such as sputtering, printing, electro plating, and chemical vapor deposition (CVD).

Referring back to FIG. 1, method 11 continues with operation 27 in which the excess conductive material 119, the metal barrier layer 117 and the three dielectric liners outside of the opening 103 is optionally removed.

Figure 8:
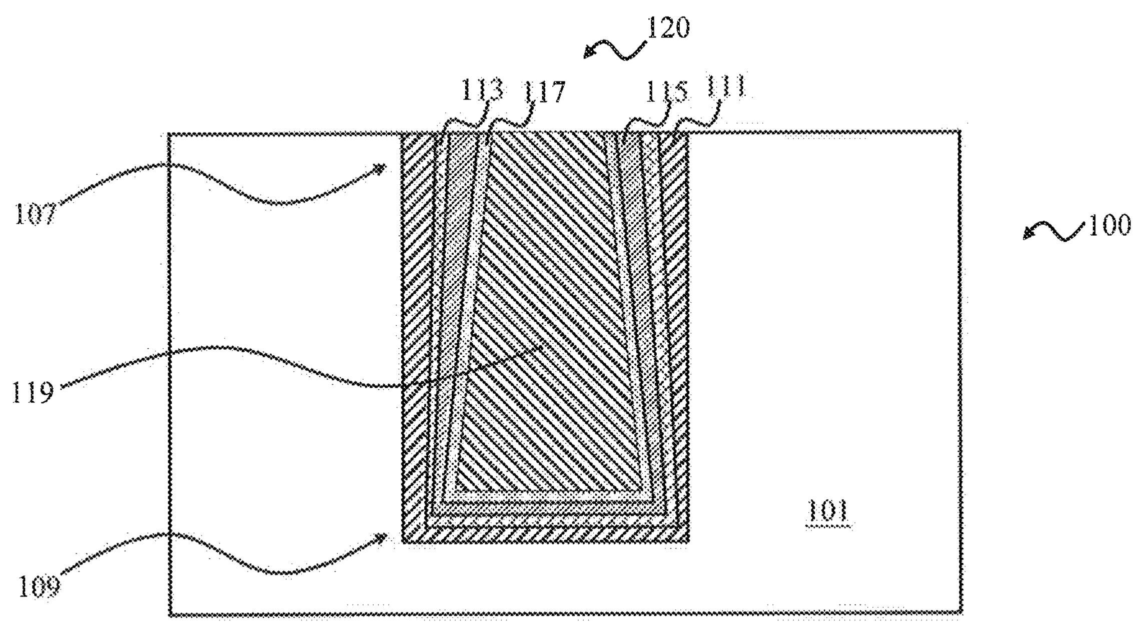

FIG. 8 illustrates the stage of operation 27 in which a cross-sectional view of the semiconductor component 100 is provided. The excess materials outside of the opening 103 are removed through a suitable process such as chemical mechanical polishing (CMP), an etching, or a combination of polishing and etching. The removal process preferably removes any conductive material 119 that is located over the metal barrier layer 117 and the three dielectric liners 111, 113 and 115 as well, so that the removal of excess materials will expose the top surface 102 of the semiconductor substrate 101 for further process steps. A through-silicon via 120 with the conductive material 119 filled in the opening 103 is formed.

In some embodiments, further process steps are optionally followed after the operation 27. Metallization layers (not shown) may be formed over the top surface 102 of the substrate 101 and are designed to connect the device structures (not shown) in the semiconductor component 100 to form functional circuitry and also to form a connection to the opposite side of the substrate 101 through the TSV 120. The metallization layers may be formed of alternating layers of dielectric and conductive material and may be formed through any suitable process (such as deposition, dual damascene).

Referring back to FIG. 1, method 11 continues with operation 29 in which a thinning process performed over the backside of the substrate to expose the TSV.

Figure 9:
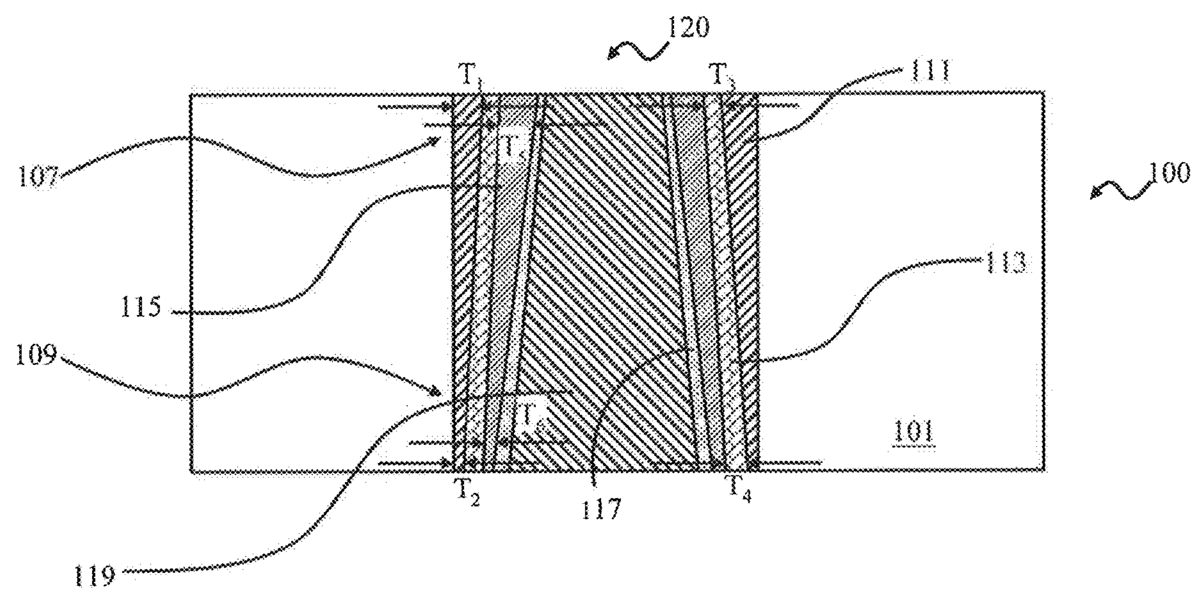

FIG. 9 illustrates the stage of operation 29 in which a cross-sectional view of the semiconductor component 100 is provided. A portion of the backside of the semiconductor substrate 101 is then removed to expose the conductive material 119 located within the opening 103 to complete the TSV 120. The removal may be performed with a grinding process such as a chemical mechanical polish (CMP), although other suitable processes, such as etching, may alternatively be used. The removal of the backside of the substrate 101 may be continued until the substrate 101 has a thickness of between about 10 μm and about 200 μm. Thereafter, the TSV 120 is exposed from backside of the substrate 101. The through-silicon via (TSV) 120 provides electrical connection for the semiconductor component formed on substrate 101 to other components.

Various embodiments of the present invention may be used to improve the conventional through-silicon via structures. For example, in the various embodiments the first dielectric liner 111 formed by PECVD repairs the damaged interior surface 105 of the opening 103. The first dielectric liner 111 provides protection from contaminations diffuse from the substrate 101 into the second dielectric liner 113 and inner layers 115, 117 and 119. The second dielectric liner 113 with conformal thickness smoothes over the variation of the thickness of the combined layer of liners 111, 113 and 115. The compressive stresses of the first dielectric liner and the third dielectric liner in combination with the tensile stress in the second dielectric liner adjust the overall stress in the TSV 120. The leakage current, device performance and yield on the completed products are thus significantly increased.

Although, the semiconductor component having through-silicon vias and the method of making the same are described according various embodiments of the present disclosure, other alternatives, replacements or modifications may present without departure from the spirit of the present disclosure.

An embodiment of the disclosure provides a semiconductor component. The semiconductor component includes a semiconductor substrate having an opening. A first dielectric liner having a first compressive stress is disposed in the opening. A second dielectric liner having a tensile stress is disposed on the first dielectric liner. A third dielectric liner having a second compressive stress disposed on the second dielectric liner.

The present disclosure also provides another embodiment of a semiconductor component. The semiconductor component includes a substrate having a top surface. The semiconductor component further includes an opening. The semiconductor component further includes a first dielectric liner having a first stress disposed in the opening. The semiconductor component further includes a second dielectric liner having a second stress disposed on the first dielectric liner, wherein a direction of the first stress is opposite a direction of the second stress. The semiconductor component further includes a third dielectric liner having a third stress disposed on the second dielectric liner, wherein a direction of the third stress is equal to the direction of the first stress. The semiconductor component further includes a conductive material disposed on within the third dielectric liner.

The present disclosure also provides another embodiment of a method of forming a semiconductor component. The method includes forming an opening in a semiconductor substrate. A first dielectric liner is deposited on the interior surface by a plasma enhanced chemical vapor deposition (PECVD). A second dielectric liner is deposited on the first dielectric liner by a conformal deposition. A third dielectric liner is deposited on the second dielectric liner by a PECVD.

An aspect of this description relates to a semiconductor component. The semiconductor component includes a substrate having an opening. The semiconductor component further includes a first dielectric liner in the opening, wherein the first dielectric liner having a thickness $T_1$ at a first end of the opening, and a thickness $T_2$ at a second end of the opening, and $R_1$ is a ratio of $T_1$ to $T_2$. The semiconductor component further includes a second dielectric liner over the first dielectric liner, wherein the second dielectric liner having a thickness $T_3$ at the first end of the opening, a thickness $T_4$ at the second end of the opening, $R_2$ is a ratio of $T_3$ to $T_1$, and $R_1$ is greater than $R_2$. In some embodiments, the opening extends through an entirety of the substrate. In some embodiments, the semiconductor component further includes a conductive material surrounded by the second dielectric liner. In some embodiments, the ratio $R_1$ ranges from about 5 to about 20. In some embodiments, the ratio $R_2$ ranges from about 1 to about 5. In some embodiments, the second dielectric liner comprises an oxide layer. In some embodiments, the first dielectric liner has an etching rate of about 1 angstrom/minute (A/min) to about 10 Å/min in a HF solution.

An aspect of this description relates to a semiconductor component. The semiconductor component includes a substrate having an opening. The semiconductor component further includes a first dielectric liner in the opening, wherein the first dielectric liner having a thickness $T_1$ at a first end of the opening, and a thickness $T_2$ at a second end of the opening, and $R_1$ is a ratio of $T_1$ to $T_2$. The semiconductor component further includes a second dielectric liner over the first dielectric liner, wherein the second dielectric liner having a thickness $T_3$ at the first end of the opening, a thickness $T_4$ at the second end of the opening, $R_2$ is a ratio of $T_3$ to $T_1$, and $R_1$ is less than $R_2$. In some embodiments, the ratio $R_1$ ranges from about 1 to about 5. In some embodiments, the ratio $R_2$ ranges from about 5 to about 20. In some embodiments, the semiconductor component further includes a third dielectric liner in the opening, wherein the third dielectric liner having a thickness $T_5$ at the first end of the opening, and a thickness $T_6$ at the second end of the opening, and $R_3$ is a ratio of $T_5$ to $T_6$. In some embodiments, $R_3$ is greater than $R_1$. In some embodiments, $R_3$ is equal to $R_2$. In some embodiments, the third dielectric liner is between the substrate and the first dielectric liner. In some embodiments, the first dielectric liner is between the second dielectric liner and the third dielectric liner. In some embodiments, the semiconductor component further includes a conductive material surrounded by the second dielectric liner.

An aspect of this description relates to a semiconductor component. The semiconductor component includes a substrate having an opening. The semiconductor component further includes a first dielectric liner in the opening, wherein the first dielectric liner having a thickness $T_1$ at a first end of the opening, and a thickness $T_2$ at a second end of the opening, and $R_1$ is a ratio of $T_1$ to $T_2$. The semiconductor component further includes a second dielectric liner over the first dielectric liner, wherein the second dielectric liner having a thickness $T_3$ at the first end of the opening, a thickness $T_4$ at the second end of the opening, $R_2$ is a ratio of $T_3$ to $T_4$, and $R_1$ is equal to $R_2$. In some embodiments, the ratio $R_1$ ranges from about 5 to about 20. In some embodiments, the semiconductor component further includes a third dielectric liner between the first dielectric liner and the second dielectric liner. In some embodiments, the semiconductor component further includes a conductive material surrounded by the second dielectric liner.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed:

1. A semiconductor component comprising:

a substrate having an opening;

a first dielectric liner in the opening, wherein the first dielectric liner having a thickness $T_1$ at a first end of the opening, and a thickness $T_2$ at a second end of the opening, and $R_1$ is a ratio of $T_1$ to $T_2$, and a second dielectric liner over the first dielectric liner, wherein the second dielectric liner having a thickness $T_3$ at the first end of the opening, a thickness $T_4$ at the second end of the opening, $R_2$ is a ratio of $T_3$ to $T_4$, and $R_1$ is greater than $R_2$.

2. The semiconductor component of claim 1, wherein the opening extends through an entirety of the substrate.

3. The semiconductor component of claim 1, further comprising a conductive material surrounded by the second dielectric liner.

4. The semiconductor component of claim 1, wherein the ratio $R_1$ ranges from about 5 to about 20.

5. The semiconductor component of claim 1, wherein the ratio $R_2$ ranges from about 1 to about 5.

6. The semiconductor component of claim 1, wherein the second dielectric liner comprises an oxide layer.

7. The semiconductor component of claim 1, wherein the first dielectric liner has an etching rate of about 1 angstrom/minute (A/min) to about 10 A/min in a HF solution.

8. A semiconductor component comprising:

a substrate having an opening;

a first dielectric liner in the opening, wherein the first dielectric liner having a thickness $T_1$ at a first end of the opening, and a thickness $T_2$ at a second end of the opening, and $R_1$ is a ratio of $T_1$ to $T_2$, and a second dielectric liner over the first dielectric liner, wherein the second dielectric liner having a thickness $T_3$ at the first end of the opening, a thickness $T_4$ at the second end of the opening, $R_2$ is a ratio of $T_3$ to $T_4$, and $R_1$ is different from $R_2$.

9. The semiconductor component of claim 8, wherein the ratio $R_1$ ranges from about 1 to about 5.

10. The semiconductor component of claim 8, wherein the ratio $R_2$ ranges from about 5 to about 20.

11. The semiconductor component of claim 8, further comprising a third dielectric liner in the opening, wherein the third dielectric liner having a thickness $T_5$ at the first end of the opening, and a thickness $T_6$ at the second end of the opening, and $R_3$ is a ratio of $T_5$ to $T_6$.

12. The semiconductor component of claim 11, wherein $R_3$ is greater than $R_1$.

13. The semiconductor component of claim 11, wherein $R_3$ is equal to $R_2$.

14. The semiconductor component of claim 11, wherein the third dielectric liner is between the substrate and the first dielectric liner.

15. The semiconductor component of claim 11, wherein the first dielectric liner is between the second dielectric liner and the third dielectric liner.

16. The semiconductor component of claim 8, further comprising a conductive material surrounded by the second dielectric liner.

17. A semiconductor component comprising:

a substrate having an opening;

a first dielectric liner in the opening, wherein the first dielectric liner having a thickness $T_1$ at a first end of the opening, and a thickness $T_2$ at a second end of the opening, and $R_1$ is a ratio of $T_1$ to $T_2$, and a second dielectric liner over the first dielectric liner, wherein the second dielectric liner having a thickness $T_3$ at the first end of the opening, a thickness $T_4$ at the second end of the opening, $R_2$ is a ratio of $T_3$ to $T_4$, $R_1$ is greater than $R_2$, and the second dielectric liner is entirely within the opening.

18. The semiconductor component of claim 17, wherein the ratio $R_1$ ranges from about 5 to about 20.

19. The semiconductor component of claim 17, further comprising a third dielectric liner between the first dielectric liner and the second dielectric liner.

20. The semiconductor component of claim 17, further comprising a conductive material surrounded by the second dielectric liner.

* * * * *